US008796748B2

(12) United States Patent
Ramberg et al.

(10) Patent No.: US 8,796,748 B2
(45) Date of Patent: Aug. 5, 2014

(54) TRANSISTORS, METHODS OF MANUFACTURE THEREOF, AND IMAGE SENSOR CIRCUITS

(75) Inventors: Fredrik Ramberg, New Taipei (TW); Tse-Hua Lu, Zhubei (TW); Tsun-Lai Hsu, Guansi Township (TW); Victor Chiang Liang, Hsin-Chu (TW); Chi-Feng Huang, Zhubei (TW); Yu-Lin Wei, Taichung (TW); Shu Fang Fu, Xinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/570,157

(22) Filed: Aug. 8, 2012

(65) Prior Publication Data

US 2014/0042506 A1    Feb. 13, 2014

(51) Int. Cl.
  *H01L 29/80*   (2006.01)
  *H01L 29/808*  (2006.01)
  *H01L 29/768*  (2006.01)
  *H01L 29/78*   (2006.01)
  *H01L 27/098*  (2006.01)
  *H01L 27/146*  (2006.01)
  *H01L 21/28*   (2006.01)

(52) U.S. Cl.
  USPC .... 257/292; 257/288; 257/345; 257/E27.133; 257/E27.069; 257/E29.233; 257/E29.27; 257/E29.312; 257/E29.31; 257/E21.177; 438/73

(58) Field of Classification Search
  USPC ............... 257/292, 345, E27.133, E27.069, 257/E29.233, E29.27, E29.312, E29.31, 257/E21.177; 438/73
  See application file for complete search history.

(56) References Cited

U.S. PATENT DOCUMENTS

| 4,914,491 | A | * | 4/1990 | Vu | 257/260 |
| 5,811,855 | A | * | 9/1998 | Tyson et al. | 257/349 |
| 6,140,687 | A | * | 10/2000 | Shimomura et al. | 257/401 |
| 6,841,822 | B2 | * | 1/2005 | Violette | 257/315 |
| 2003/0113959 | A1 | * | 6/2003 | Min et al. | 438/151 |
| 2003/0211663 | A1 | * | 11/2003 | Min et al. | 438/148 |
| 2007/0048925 | A1 | * | 3/2007 | McStay et al. | 438/213 |
| 2010/0052069 | A1 | * | 3/2010 | Wirbeleit | 257/369 |
| 2010/0081239 | A1 | * | 4/2010 | Min et al. | 438/151 |
| 2012/0193724 | A1 | * | 8/2012 | Wirbeleit | 257/369 |

OTHER PUBLICATIONS

Wang, R.-V., et al., Shallow Trench Isolation Edge Effect on Random Telegraph Signal Noise and Implications for Flash Memory,: IEEE Transactions on Electron Devices. vol. 56, No. 9, Sep. 2009, pp. 2107-2113.

* cited by examiner

*Primary Examiner* — Victor A Mandala
(74) *Attorney, Agent, or Firm* — Slater and Matsil, L.L.P.

(57) ABSTRACT

Transistors, methods of manufacturing thereof, and image sensor circuits are disclosed. In one embodiment, a transistor includes a buried channel disposed in a workpiece, a gate dielectric disposed over the buried channel, and a gate layer disposed over the gate dielectric. The gate layer comprises an I shape in a top view of the transistor.

20 Claims, 6 Drawing Sheets

TRANSISTORS, METHODS OF MANUFACTURE THEREOF, AND IMAGE SENSOR CIRCUITS

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). Early MOSFET processes used one type of doping to create either positive or negative channel transistors. More recent designs, referred to as complimentary MOS (CMOS) devices, use both positive and negative channel devices in complementary configurations. While this requires more manufacturing steps and more transistors, CMOS devices are advantageous because they utilize less power, and the devices may be made smaller and faster.

One type of device that can be manufactured using CMOS processes is a CMOS image sensor (CIS). One problem facing CMOS image sensors is a high amount of random telegraph signal (RTS) noise in pixel source follower and reset gate transistors, which decreases image sensor sensitivity.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to transistor designs for CMOS image sensors. Novel transistor designs, methods of manufacture thereof, and image sensor circuits that utilize the transistors will be described herein.

Figure 1:
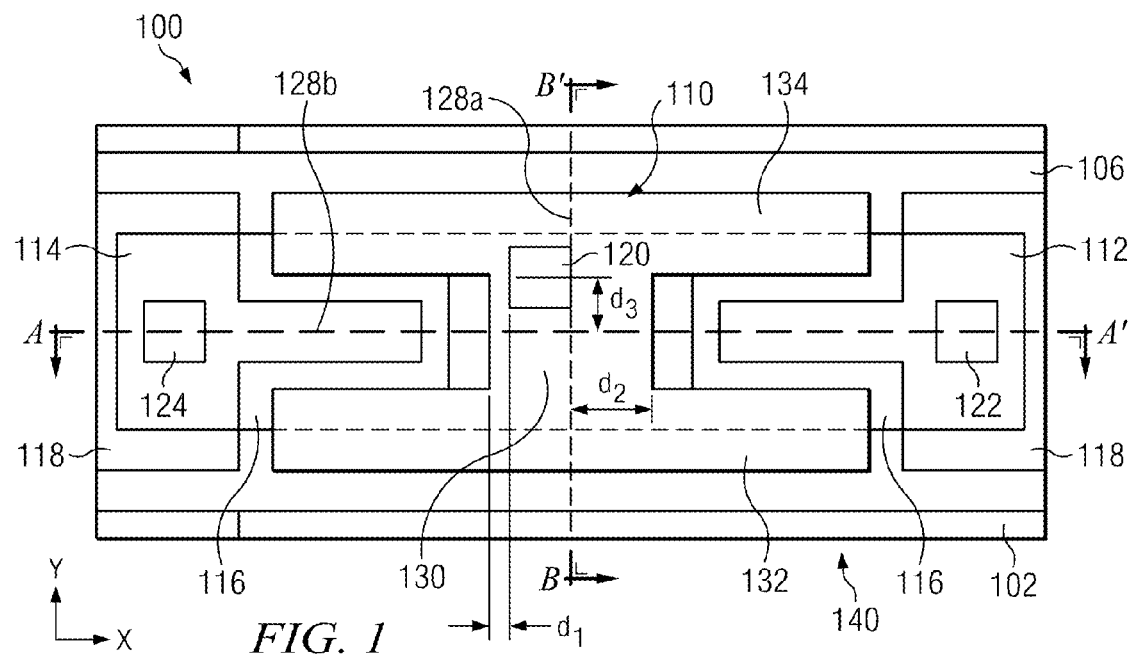
FIG. 1 is a top view of a transistor in accordance with an embodiment of the present disclosure.

FIG. 1 is a top view of a semiconductor device 100 that includes a transistor 140 in accordance with an embodiment of the present disclosure. The transistor 140 has a gate 110 that comprises an I shape in the top view. The gate 110 is also referred to herein, e.g., in some of the claims, as a gate layer 110, for example. The gate 110 includes a first elongated member 130, a second elongated member 132 coupled to a first end of the first elongated member 130, and a third elongated member 134 coupled to a second end of the first elongated member 130. The second elongated member 132 and the third elongated member 134 are positioned about perpendicular to the first elongated member 130 in a shape of a letter "I". The first elongated member 130 comprises a width on a shortest side of about 50 μm or less in an embodiment. In one embodiment, the first elongated member 130 comprises a width of about 0.12 μm. The first elongated member 130 comprises a length on a longest side of about 0.5 μm or less in an embodiment. In one embodiment, the first elongated member 130 comprises width of about 0.2 to 0.3 μm. The first elongated member 130 may alternatively comprise other dimensions. The second and third elongated members 132 and 134 comprise a width and a length that are substantially the same as or greater than the width and length of the first elongated member 130, in some embodiments, although alternatively, the second and third elongated members 132 and 134 may comprise other dimensions.

Figure 2:
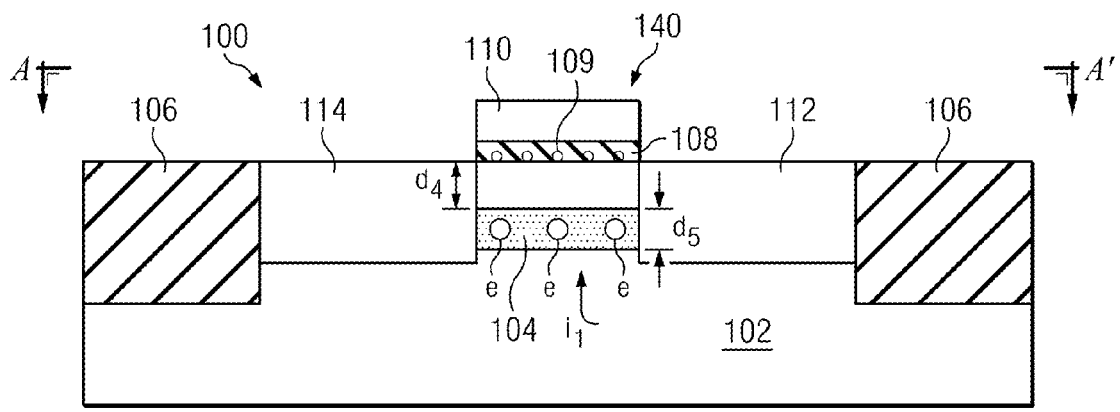
FIG. 2 is a cross-sectional view of the transistor shown in FIG. 1.

FIG. 2 is a cross-sectional view of the transistor 140 shown in FIG. 1 at A-A'. The gate 110 is disposed over a gate dielectric 108. The gate dielectric 108 is disposed over a workpiece 102 that includes a buried channel 104 formed therein below a top surface of the workpiece 102. The buried channel 104 is formed by implanting a dopant beneath the top surface of the workpiece 102. A source region 112 is formed on one side of the buried channel 104 and a drain region 114 is formed on the other side of the buried channel 104. The source region 112 and the drain region 114 include implantation regions 116 and 118 (see FIG. 1) in some embodiments. A shallow trench isolation (STI) region 106 is formed around the transistor 140.

Figure 3:
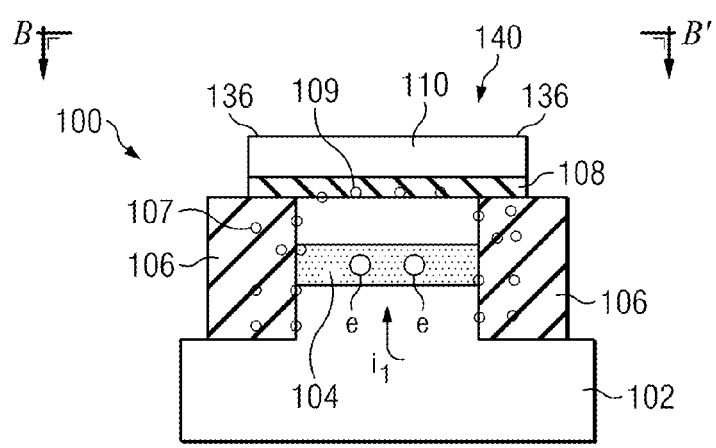
FIG. 3 is another cross-sectional view of the transistor shown in FIG. 1.

FIG. 3 is another cross-sectional view of the transistor 140 shown in FIG. 1 at B-B' at a view or angle that is substantially perpendicular to the cross-sectional view shown in FIG. 2. FIG. 3 illustrates interface traps 107 at edges of the STI region 106. FIGS. 2 and 3 illustrate interface traps 109 at the bottom surface of the gate dielectric 108 proximate the top surface of the workpiece 102. The novel transistor 140 design advantageously avoids deleterious effects of the interface traps 107 and 109 by causing current $i_1$ during operation of the transistor 140 to flow in a more central region of the buried channel 104, which results in reduced noise for the transistor 140. The combination of the I shaped gate 110 and the buried channel 104 causes electrons e in the current $i_1$ to avoid the interface traps 107 along the sides of the STI region 106 edges and also causes electrons e in the current $i_1$ to travel deep beneath the gate 110 to avoid the interface traps 109 in the gate dielectric 108.

FIG. 1 also illustrates the placement locations of contacts 120, 122, and 124 of the transistor 140 in accordance with some embodiments. The contacts 120, 122, and 124 are formed over the transistor 140 within an insulating material (not shown) disposed over the transistor 140. Conductive lines, vias, and/or contact pads (also not shown) may be formed over and coupled to the contacts 120, 122, and 124 so that electrical contact may be made to the transistor 140, for example. The source contact 122 is disposed over and is electrically connected to the source region 112. The drain contact 124 is disposed over and is electrically connected to the drain region 114. The gate contact 120 is disposed over and is electrically connected to the gate 110.

In some embodiments, the gate contact 120 is closer to the drain contact 124 than the source contact 122. In FIG. 1, the gate contact 120 is spaced apart from an edge of the first elongated member 130 nearest the drain contact 124 by a dimension $d_1$, and the gate contact 120 is spaced apart from an edge of the first elongated member 130 nearest the source contact 122 by a dimension $d_2$, wherein dimension $d_2$ is greater than dimension $d_1$, for example. The gate contact 120 is offset from a center 128a along a y-axis y of the I-shaped gate 110.

In some embodiments, the gate contact 120 is offset from the source contact 122 and the drain contact 124 in a top view of the transistor 140. In FIG. 1, the source contact 122 and the drain contact 124 are aligned along a center 128b of the I-shaped gate 110. A center of the gate contact 120 is offset from the center 128b of the I-shaped gate 110 along an x-axis x by a dimension $d_3$, wherein dimension $d_3$ is greater than zero. Dimensions $d_1$ and $d_3$ may comprise about 0.12 µm or less in some embodiments, for example. In other embodiments, dimensions $d_1$ and $d_3$ may comprise about 0.12 µm or greater, as another example.

The offset gate contact 120 further contributes to reducing noise of the transistor 140 in some embodiments. In other embodiments, the gate contact 120 is not offset, not shown in the drawings.

To manufacture the transistor 140, first a workpiece 102 is provided, as shown in FIG. 2. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples. The workpiece 102 may comprise one or more layers of electrical circuitry and/or electronic functions formed thereon, and may include conductive lines, vias, capacitors, diodes, transistors, resistors, inductors, and/or other electrical components formed in a front end of the line (FEOL) process, for example (not shown). The workpiece 102 comprises a P type substrate (P-sub) in some embodiments.

STI regions 106 are formed in the workpiece 102 by forming a mask over the workpiece 102 and patterning the mask with a desired pattern for the STI regions 106 using lithography. The mask may comprise silicon nitride or other insulating materials, for example. The mask is then used as a mask during an etch process or other removal process to remove top portions of the exposed workpiece 102 and form trenches for the STI region 106. The trenches extend in and out of the paper lengthwise in the view shown in FIG. 2, for example. Two trenches may be formed for each transistor 140, or a continuous trench may be formed encircling a region of the workpiece 102 wherein the transistor 140 is formed, as shown in the top view in FIG. 1. A plurality of trenches may be formed across a surface of the workpiece 102 for an array of transistors 140, for example, not shown. The mask is then removed.

The trenches are filled with an insulating material. The insulating material may comprise silicon dioxide, silicon nitride, other insulating materials, or multiple layers or combinations thereof, as examples. Excess insulating material and the mask are removed from the top surface of the workpiece 102, using one or more chemical mechanical polishing and/or etch processes, exposing the top surface of the workpiece 102 and the insulating material which comprises the STI regions 106.

Another mask is formed over the workpiece 102 and STI regions 106. The mask is patterned using lithography to expose the workpiece 102 in the channel regions between the STI regions 106. The channel regions of the workpiece 102 are implanted with a dopant or dopants to form the buried channel 104. The implantation process may comprise implanting a dopant such as B, P, or As at about 10 Kev to 200 Kev at a dosage of about $1\times10^{14}$ to $1\times10^{15}/cm^2$, as examples, although alternatively, other types of dopants, implantation processes, and parameters may be used to form the buried channel 104. The buried channel 104 comprises an N buried channel implant in some embodiments, e.g., in embodiments wherein the workpiece 102 comprises a P-sub. The dopants are implanted a predetermined distance beneath the top surface of the workpiece 102 to form the buried channel 104. A top surface of the buried channel 104, measured along a center axis 128b of the buried channel 104, resides a distance of dimension $d_4$ below the top surface of the workpiece 102, wherein dimension $d_4$ comprises about 0.05 µm to 0.5 µm beneath the top surface of the workpiece 102, as an example, as shown in FIG. 2. As an another example, also illustrated in FIG. 2, a top surface of the buried channel 104, measured along a center axis 128b of the buried channel 104, resides a distance of dimension $d_4$ below a bottom surface of the gate dielectric 108, wherein dimension $d_4$ comprises about 0.05 µm to 0.5 µm beneath the bottom surface of the gate dielectric 108. The buried channel 104 comprises a thickness in the cross-sectional view of FIG. 2 comprising dimension $d_5$, wherein dimension $d_5$ comprises about 0.05 µm to 0.5 µm, for example. The thickness in the cross-sectional view of FIG. 2 is measured along a center axis 128b of the buried channel 104 from a top surface of the buried channel 104 to a bottom surface of the buried channel 104, as an example. Alternatively, dimensions $d_4$ and $d_5$ may comprise other values. The buried channel 104 is formed deep enough within the workpiece 102 to avoid the interface traps 109 shown in FIGS. 2 and 3 that reside at the edge of the gate dielectric 108 proximate the top surface of the workpiece 102 in some embodiments, as an example.

A gate dielectric material 108 comprising an insulating material is formed over the workpiece 102 and the STI regions 106, and a gate material 110 comprising a conductive material, a semiconductive material, or multiple layers or combinations thereof is formed over the gate dielectric material 108. The gate dielectric material 108 comprises an oxide, and the gate material 110 may comprise polysilicon, in some embodiments. The polysilicon gate material 110 is implanted with a dopant in some embodiments to increase a threshold voltage $V_t$ of the transistor 140. The gate material 110 may be implanted with a dopant so that it comprises a P+ material. For example, the gate material 110 may be implanted with B after the deposition of the gate material 110. Alternatively, the gate dielectric material 108 and the gate material 110 may comprise other materials, and the gate material 110 may be implanted with other substances or at other times during the manufacturing process.

The gate material 110 and the gate dielectric material 108 are patterned using lithography to form a gate 110 (or gate layer 110) and gate dielectric 108 of the transistor 140 disposed over the workpiece 102. The gate 110 and the gate dielectric 108 comprise the I shape shown in FIG. 1. A portion of the gate 110 and gate dielectric 108 reside over edges of the STI regions 106 and a portion of the STI region 106, as shown in FIG. 3 at 136 in some embodiments. Alternatively, a portion of the gate 110 and gate dielectric 108 may not reside over a portion of the STI regions 106, for example. The buried channel 104 resides beneath the gate dielectric 108 within the workpiece 102, as shown.

In some embodiments, the buried channel 104 may be formed after the deposition of the gate dielectric material 108, as another example, rather than before the deposition of the gate dielectric material 108. The dopants of the buried channel 104 may be implanted through the gate dielectric material 108, for example. Portions of source and drain regions 112 and 114 may also be formed prior to the deposition of the gate dielectric material 108 by implanting portions of the workpiece 102, for example, to form implantation regions 116 and/or 118 shown in FIG. 1 or portions of implantation regions 116 and/or 118. Implantation regions 118 may comprise deep implantation regions and implantation regions 116 may comprise shallow implantation regions of the source region 112 and the drain region 114, for example.

After the gate 110 and gate dielectric 108 are patterned, another implantation process is used to form the source and drain regions 112 and 114 proximate the top surface of the workpiece 102 in some embodiments. The workpiece 102 may also be implanted with implantation regions 116 and/or 118 for the source and drain regions 112 and 114, before the gate dielectric 108 is deposited, for example.

The buried channel 104 and the I-shaped gate 110 reduce current $i_1$ flow in the channel of the transistor 140 at edge regions proximate the STI region 106 during the operation of the transistor 140, which advantageously reduces noise of the transistor 140. The buried channel 104 and I shape of the gate 110 cause current $i_1$ to tend not to flow at the STI region 106 edges which contain trapped charges 107, for example. Furthermore, because the channel 104 is buried, trapped charges 109 in the gate dielectric 108 are also avoided, further reducing noise of the transistor 140.

Figure 4:
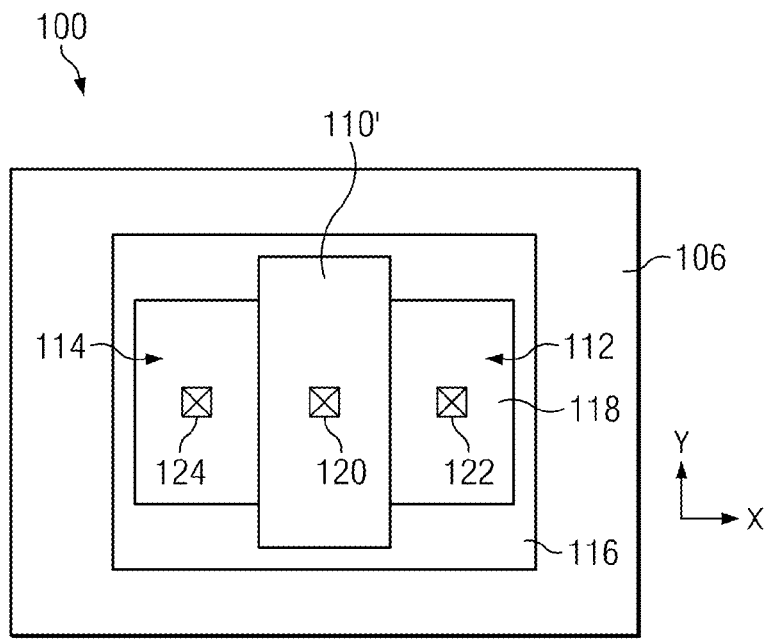
FIG. 4 is a top view of a prior art transistor.
Figure 5:
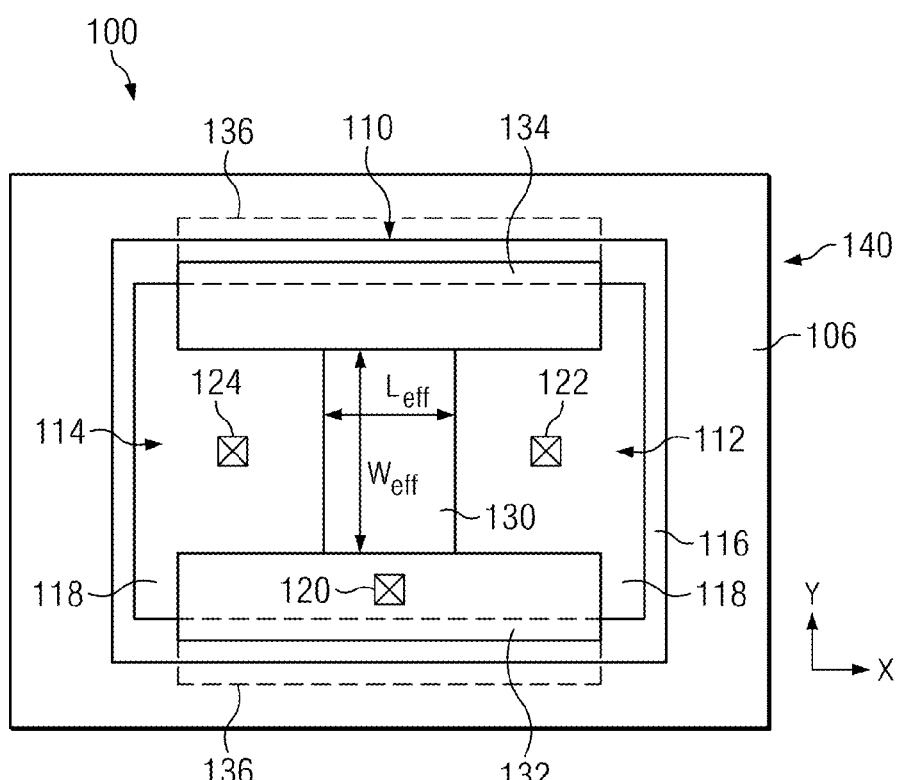
FIG. 5 is a top view of a transistor with an I shaped gate in accordance with an embodiment.

Some design methods of the novel transistors 140 will next be described. FIG. 4 is a top view of a prior art transistor having a gate 110' that is rectangular shape. The gate contact 120 is aligned with the source contact 122 and the drain contact 124 along the x-axis x. FIG. 4 illustrates an initial design of a transistor that is modified in accordance with some embodiments: the transistor shown in FIG. 4 is not actually manufactured. FIG. 5 is a top view of the transistor of FIG. 4 that is modified in accordance with various embodiments to have an I-shaped gate 110. The layout of the gate 110 is modified so the active channel within the channel region 104 (see FIG. 3) is forced far away from the STI region 106 interface, so that impact from STI region 106 interface traps (see traps 107 in FIG. 3) is minimized. The effective length $L_{eff}$ and width $W_{eff}$ of a channel of the transistor 140 below a portion (e.g., below the first elongated member 130) of the gate 110 are illustrated in FIG. 5. In addition, the gate contact 120 is positioned so that it is offset on the x-axis x from the source and drain contacts 122 and 124. The gate contact 120 is not disposed directly over the first elongated member 130 of the I-shaped gate 110, improving the performance of the transistor 140. In some embodiments, a portion of the second elongated member 132 of the gate 110 is disposed over a first edge of the STI region 106, and a portion of the third elongated member 134 of the gate 110 is disposed over a second edge of the STI region 106, as shown in phantom at 136.

Figure 6:
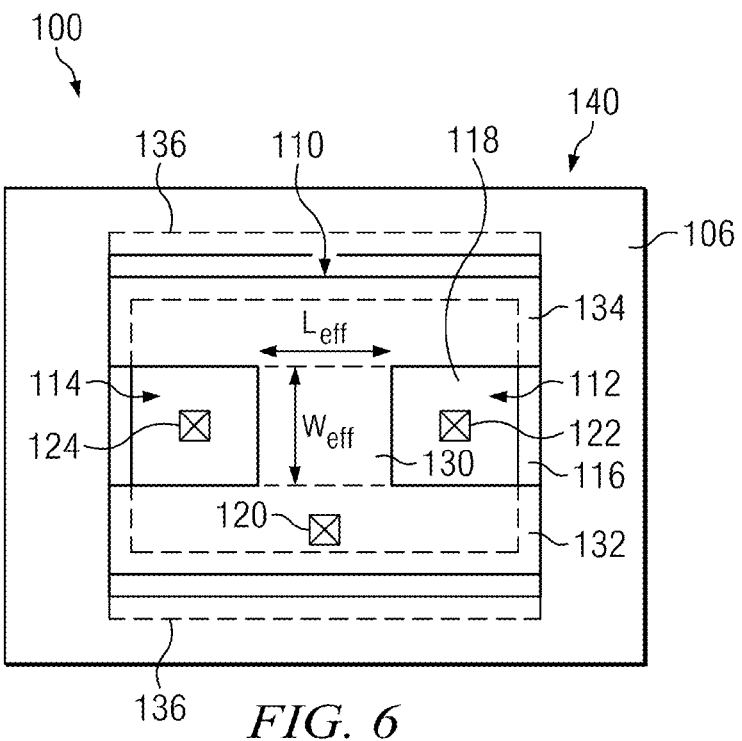
FIG. 6 is a top view of a transistor with an I shaped gate in accordance with another embodiment.

FIG. 6 is a top view of a transistor 140 with an I shaped gate in accordance with various embodiments. FIG. 6 illustrates a configuration similar to that shown in FIG. 5, wherein the design rules are tightened in order to avoid an area penalty of implementing a larger gate I-beam 110 design. The source and drain regions 112 and 114 and the first elongated member 130 are reduce in size, and the ends of the second and third elongated members 132 and 134 are extended to reach the edges of the STI region 106. The effective width $W_{eff}$ of the channel of the transistor 140 below a portion (e.g., the first elongated member 130) of the gate 110 is reduced in comparison to the embodiment shown in FIG. 5. The effective width $W_{eff}$ of the channel of the transistor 140 below the first elongated member 130 of the gate 110 may be reduced by about 20% or greater, as an example. The effective width $W_{eff}$ of the channel of the transistor 140 below the first elongated member 130 of the gate 110 may alternatively be reduced by other amounts. The length of the second and third elongated members 132 and 134 is also reduced, e.g., by about 10% or greater, in some embodiments. The length of the second and third elongated members 132 and 134 may alternatively be reduced by other amounts. The gate contact 120 is positioned so that it is offset from the source and drain contacts 122 and 124. The gate contact 120 is not disposed directly over the first elongated member 130 of the I-shaped gate 120, improving the performance of the transistor 140. In some embodiments, a portion of the second elongated member 132 of the gate 110 is disposed over a first edge of the STI region 106, and a portion of the third elongated member 134 of the gate 110 is disposed over a second edge of the STI region 106, as shown in phantom at 136. Thus, FIG. 6 illustrates that the overall size of the transistor 140 can be reduced, advantageously requiring less area on an integrated circuit.

Figure 7:
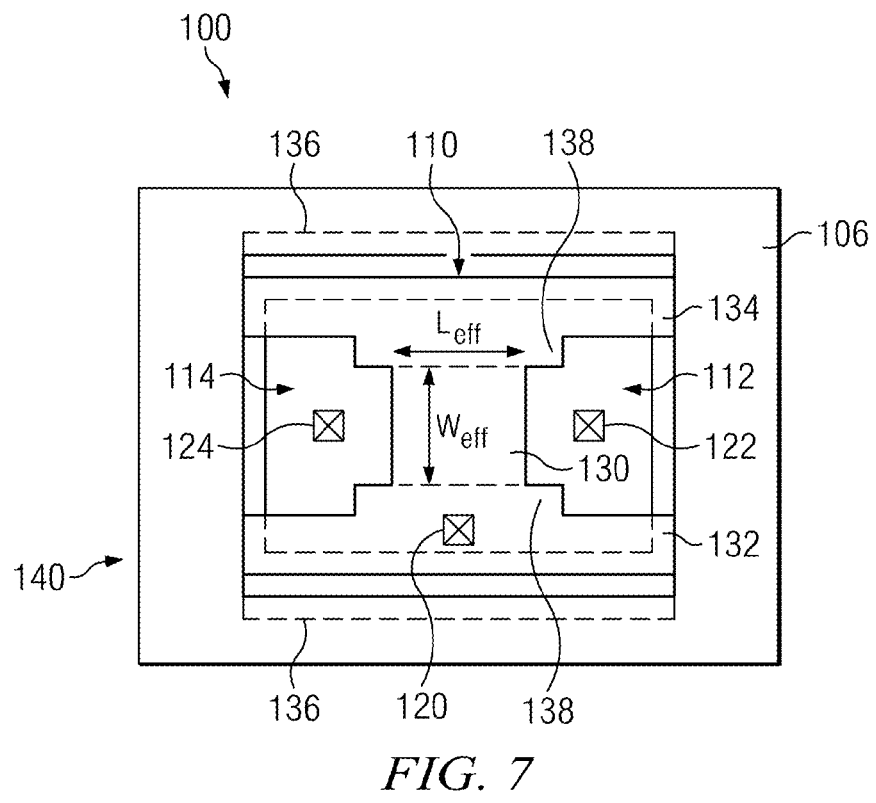
FIG. 7 is a top view of a transistor with an I shaped gate in accordance with yet another embodiment.

FIG. 7 is a top view of a transistor 140 with an I shaped gate 110 in accordance with yet another embodiment. The second elongated member 132 and the third elongated member 134 comprise an increased width proximate the first end and the second end, respectively, of the first elongated member 130, as shown at 138. The increased widths 138 of the second and third elongated members 132 and 134 of the gate 110 proximate the ends of the first elongated member 130 advantageously allow space for placement of the offset gate contact 120, without increasing the overall transistor 140 device layout area.

Figure 8:
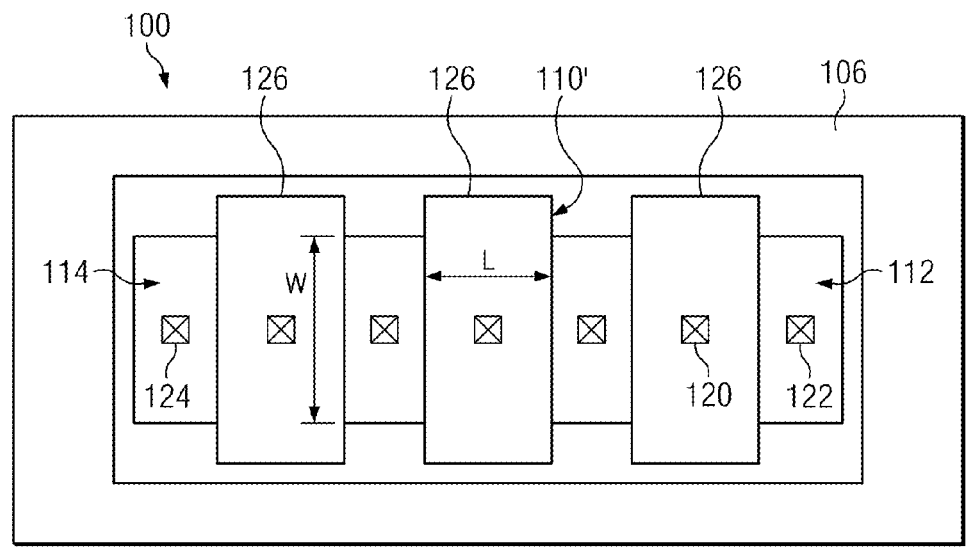
FIG. 8 is a top view of a prior art transistor including multiple gate portions.
Figure 9:
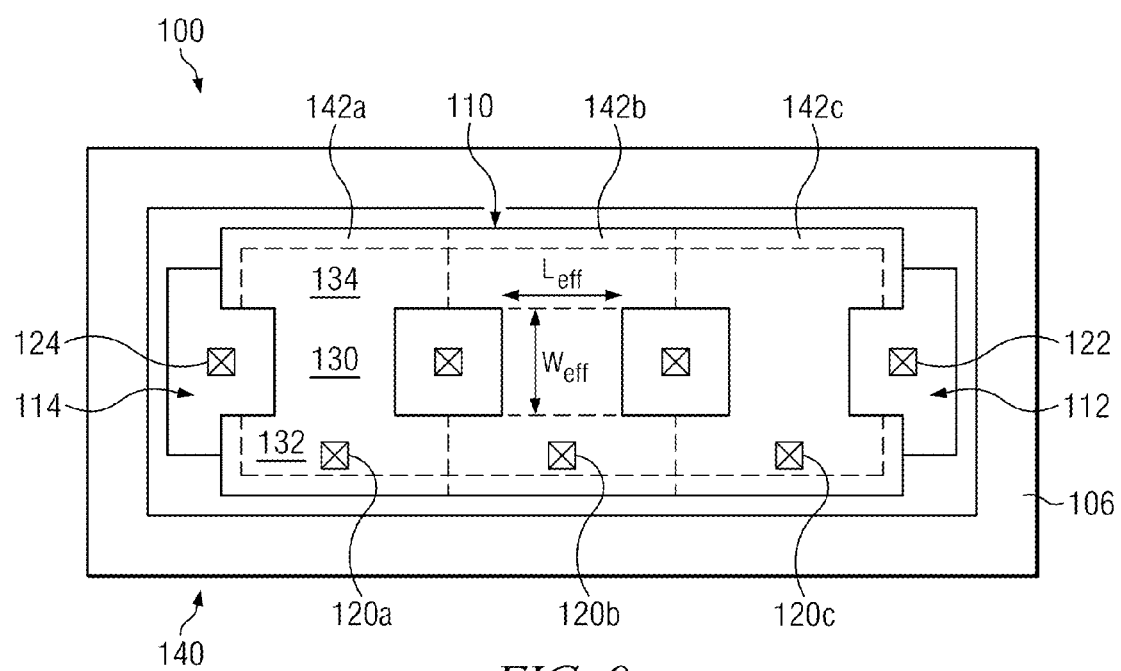
FIG. 9 is a top view of a transistor in accordance with an embodiment that includes a plurality of I shaped portions.

The transistor 140 concepts described herein are also implementable in multiple finger devices. As an example, FIG. 8 is a top view of a prior art transistor including a gate 110' having multiple portions 126. FIG. 8 illustrates an initial design of a transistor that is modified in accordance with some embodiments of the present disclosure: the transistor shown in FIG. 8 is not actually manufactured. Some embodiments of the present disclosure are implemented in such transistor gate 110' designs, as shown in FIG. 9, which illustrates a top view of a transistor 140 having a gate 110. The portions 126 of the prior art gate 110' of FIG. 8 are modified to each comprise an I shape: see portions 142a, 142b, and 142c of gate 110 in FIG. 9. The gate 110 of the transistor 140 includes a plurality of the I shaped portions 142a, 142b, and 142c in accordance with an embodiment. The portions 142a, 142b, and 142c of the gate each comprise an I shape. Each of the plurality of I shaped portions 142a, 142b, and 142c is coupled to another one of the plurality of I shaped portions. For example, I shaped portion 142a is coupled to one side of I shaped portion 142b, and the other side of I shaped portion 142b is coupled to a side of I shaped portion 142c. A gate 110 comprising three I shaped portions 142a, 142b, and 142c is shown in FIG. 9; alternatively, the gate 110 may comprise two I shaped portions, or four or more I shaped portions, in accordance with some embodiments.

The gate contacts 120a, 120b, and 120c are is not disposed directly over the first elongated members 130 of the I-shaped gate 110 portions 142a, 142b, and 142c, respectively, in some embodiments, further improving the performance of the transistor 140. In some embodiments, portions of the second elongated members 132 of the portions 142a, 142b, and 142c of the gate 110 may be disposed over an edge of the STI region 106, and portions of the third elongated members 134 of the portions 142a, 142b, and 142c of the gate 110 may be disposed over an edge of the STI region 106 (not shown in FIG. 9; see FIGS. 5, 6, and 7 at 136).

Figure 10:
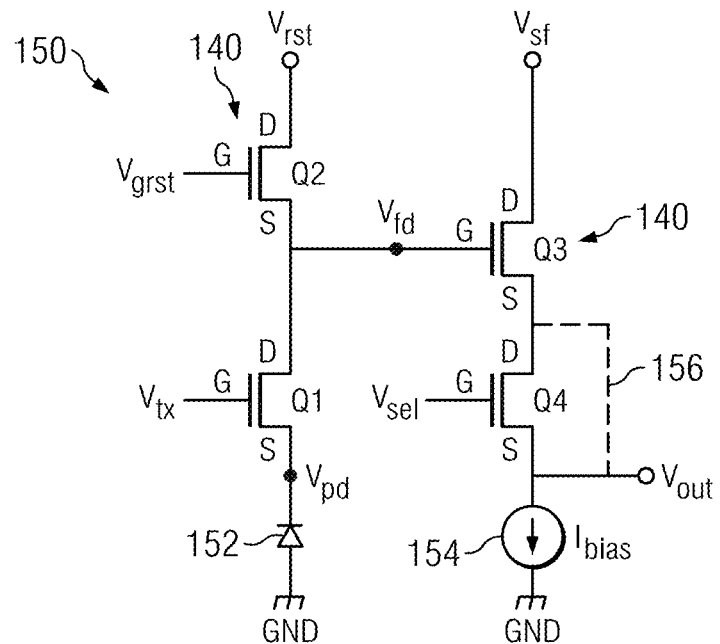
FIG. 10 is a schematic diagram of a CMOS image sensor circuit in which the novel transistors of some embodiments of the present disclosure may be implemented.

FIG. 10 is a schematic diagram 150 of a CMOS image sensor circuit in which novel transistors 140 of embodiments of the present disclosure may be implemented. The schematic diagram 150 is a circuit of an image sensor that includes a photo diode 152 and a first transistor Q1 coupled to the photo diode 152. A second transistor Q2 is coupled to the first transistor Q1, and a third transistor Q3 is coupled to the first transistor Q1 and the second transistor Q2, as shown. A current source 154 adapted to provide a bias current $I_{bias}$ is coupled to the third transistor Q3 in some embodiments, as shown in phantom at 156. The second transistor Q2, the third transistor Q3, or both the second transistor Q2 and the third transistor Q3 comprises a transistor 140 previously described in the embodiments herein that includes an I-shaped gate 110 and a buried channel 104. The second and/or third transistor Q2 or Q3 comprising the transistor 140 advantageously has reduced noise, resulting in reduced noise in the image sensor circuit 150 because more current flows in the center of the buried channel 104 away from edge regions proximate the STI regions 106 which can be a source of noise.

The photo diode 152, the first transistor Q1, the second transistor Q2, and the third transistor Q3 comprise CMOS devices in accordance with embodiments of the present disclosure. The first transistor Q1, the second transistor Q2, and the third transistor Q3 each comprise a source S, a drain D, and a gate G. A first side of the photo diode 152 is coupled to a return voltage or ground GND, and a second side of the photo diode 152 is coupled to the source S of the first transistor Q1. The drain D of the first transistor Q1 is coupled to the source S of the second transistor Q2 and the gate G of the third transistor Q3, e.g., by wiring. The source S of the third transistor Q3 is coupled to the current source 154 in some embodiments, as shown in phantom at 156. One side of the current source 154 is coupled to ground GND.

The third transistor Q3 may comprise a source follower transistor and may be coupled to a terminal $V_{sf}$ for source follower voltage at the drain D. An output voltage terminal $V_{out}$ may be coupled to the source S of the third transistor Q3 in an embodiment, as shown in phantom at 156. The first transistor Q1 may comprise a transfer gate transistor and may be coupled to a terminal $V_{tx}$ for a transfer gate voltage at the gate G. The second transistor Q2 may comprise a reset gate transistor and may be coupled to a terminal $V_{grst}$ for a gate reset voltage at the gate G and coupled to a terminal $V_{rst}$ at the drain D, as shown. The first transistor Q1, the second transistor Q2, and the third transistor Q3 comprise n-type metal oxide semiconductor (NMOS) devices in an embodiment, although alternatively, the first, second, and third transistors Q1, Q2, and Q3 may comprise other types of devices. Alternatively, the circuit 150 may comprise other configurations, to be described further herein.

The photo diode 152 of the image sensor circuit 150 is adapted to perform a photoelectric conversion, e.g., to accumulate a light signal charge or retrieve information regarding an image the image sensor circuit 150 is exposed to. The first transistor Q1 comprising the transfer gate transistor is adapted to transfer a signal charge obtained at the photo diode 152 to the third transistor Q3 comprising the source follower transistor. The third transistor Q3 is adapted to read out and change an output voltage in accordance with an input voltage received at a predetermined voltage gain. The third transistor Q3 may be adapted to amplify the signal transferred by the first transistor Q1, for example. The second transistor Q2 comprising the reset transistor is adapted to discharge a signal charge accumulated at the gate G of the second transistor Q2 upon receipt of a reset signal received at voltage terminal Vgrst, for example.

Embodiments of the present disclosure also have useful application in other types of image sensor circuits or active pixel sensors (APSs). As an example, some embodiments may be implemented in an image sensor circuit 150 having a row select transistor Q4 coupled thereto, also shown in FIG. 10. The row select transistor Q4 comprises a fourth transistor of the image sensor circuit 150 that is coupled between the source follower transistor Q3 and the current source 154. The source S of the source follower transistor Q3 is coupled to a drain D of the row select transistor Q4, and a source S of the row select transistor Q4 is coupled to the current source 154. An output voltage terminal $V_{out}$ may be coupled to the source S of the row select transistor Q4. A voltage $V_{sel}$ may be applied to a gate G of the row select transistor Q4 to select a row of pixels in an array of pixels, for example.

The image sensor circuit 150 may comprise a read-out circuit for one pixel that includes a single photo diode 152 in an array of a plurality of pixels (not shown) of a CMOS image sensor. The array may include hundreds or thousands of pixels arranged in a matrix, each comprising an image sensor circuit 150 shown in FIG. 10, as an example. The image sensor circuit 150 may be implemented in a digital camera or other imaging devices, for example.

Figure 11:
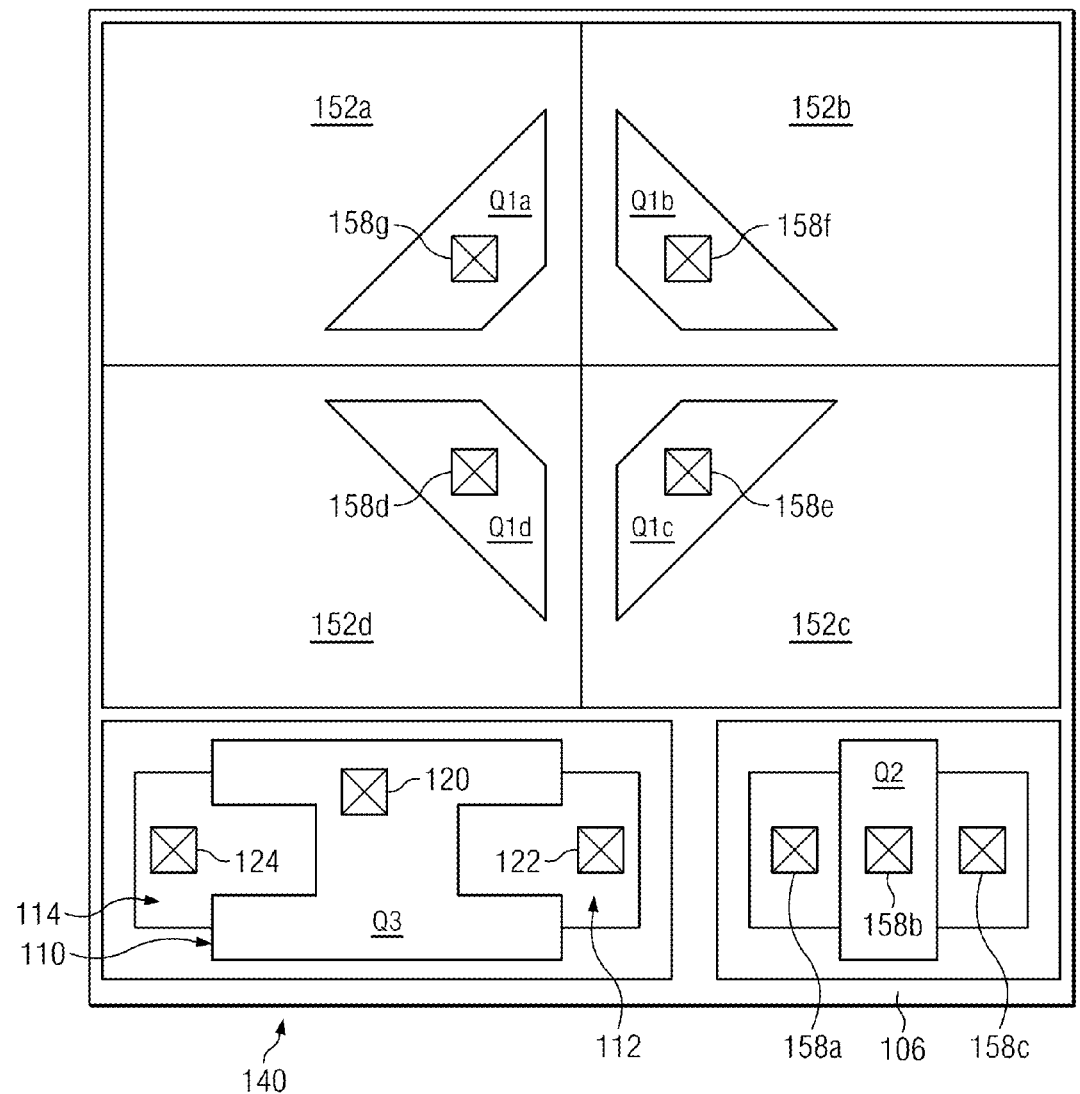
FIG. 11 is a top view of a layout of a CMOS image sensor circuit that includes a plurality of photo diodes in accordance with an embodiment.

In some embodiments, a pixel cell may include plurality of photo diodes 152a, 152b, 152c, and 152d, as shown in FIG. 11, which is a top view of a layout of a CMOS image sensor circuit 150 in accordance with an embodiment. The four photo diodes 152a, 152b, 152c, and 152d are each controlled by a corresponding transfer gate transistor Q1a, Q1b, Q1c, and Q1d, respectively. The four photo diodes 152a, 152b, 152c, and 152d are also controlled by shared transistors Q2 and Q3. The source follower transistor Q3 comprises a transistor 140 having a buried channel 104 and an I-shaped gate 110 described herein. Contacts 158a, 158b, and 158c comprise contacts for the source, gate, and drain, respectively, of the reset gate transistor Q2. Contacts 158d, 158e, 158f, and 158g comprise contacts for the transfer gate transistors Q1a, Q1b, Q1c, and Q1d, respectively. The transfer gate transistors Q1a, Q1b, Q1c, and Q1d are each disposed proximate one of the photo diodes 152a, 152b, 152c, and 152d, respectively.

In FIG. 11, only the source follower transistor Q3 comprises a transistor 140 described herein that includes a buried channel 104 and an I-shaped gate 110. Alternatively, only the reset gate transistor Q2 comprises a transistor 140 that includes a buried channel 104 and an I-shaped gate 110, in another embodiment. In other embodiments, both the source follower transistor Q3 and the reset gate transistor Q2 comprise transistors 140 that each include a buried channel 104 and an I-shaped gate 110.

Furthermore, only four photo diodes 152a, 152b, 152c, and 152d are shown in FIG. 11. The transistors 140 described herein may also be implemented in CMOS image sensors having other numbers of photo diodes 152a, 152b, 152c, and 152d. For example, some CMOS image sensor designs that the novel transistors 140 may be implemented in may include eight photo diodes 152a, 152b, 152c, and 152d or other numbers of photo diodes 152a, 152b, 152c, and 152d.

Portions of the workpiece 102 may be masked during the various manufacturing processes for the transistors 140 described herein in some embodiments. In other embodiments, other portions of the CMOS image sensor circuit 150 may be simultaneously formed during the manufacturing of the transistors 140, such as forming portions of the photo diode 152, the first transistor Q1, the second transistor Q2, the third transistor Q3, the fourth transistor Q4, and other elements of the circuit 150, not shown.

Figure 12:
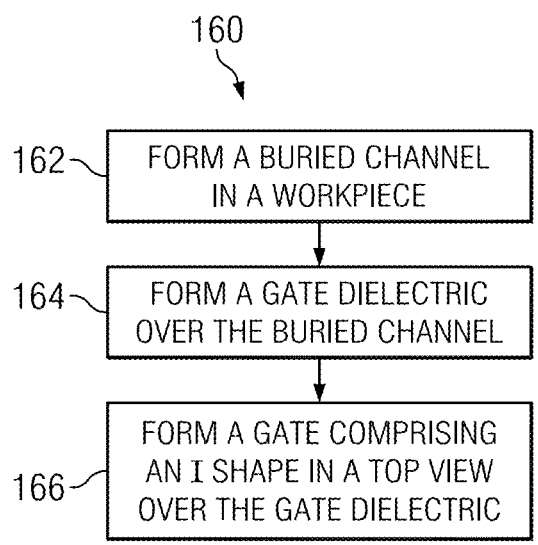
FIG. 12 is a flow chart illustrating a method of manufacturing a transistor in accordance with an embodiment.

FIG. 12 is a flow chart 160 illustrating a method of manufacturing a transistor 140 shown in FIG. 2 in accordance with an embodiment. In step 162, a buried channel 104 is formed in a workpiece 102. In step 164, a gate dielectric 108 is formed over the buried channel 104. In step 166, a gate 110 comprising an I shape in a top view is formed over the gate dielectric 108.

Advantages of embodiments of the disclosure include providing novel transistor 140 designs that have reduced noise and that do not require that their size be increased to reduce noise. The transistors 140 improve metal oxide semiconductor field effect transistor (MOSFET) device noise performance by reducing the impact from STI region 106 traps 107. The MOSFET I-beam layout techniques described herein for gates 110 of the transistors 140 effectively reduce noise. A greater amount of current $i_1$ is passed through the central region of the buried channel 104 during operation of the transistor 140, which reduces noise by avoiding or reducing current flow in edge regions of the buried channel 104 proximate the STI regions 106, advantageously. A voltage applied to the transistors 140 creates a greater amount of current through the central region of the channel than in the edge regions of the channel proximate the STI regions 106, for example.

The noise of the transistors 140 is reduced two ways in accordance with some embodiments: first, by the I-beam shape of the gate 110, which reduces deleterious effects on noise caused by STI region 106 interface traps 107, and second, by the inclusion of the buried channel 104, which reduces deleterious effects on noise caused by gate dielectric 108 interface traps 109. Implementing both the I-beam shaped gate 110 and the buried channel 104 in the transistor 140 design has a synergistic effect in improving noise performance of the transistors 140 in some embodiments, advantageously.

The novel transistors 140 are easily implementable in manufacturing process flows for image sensor and other types of circuits. The transistors 140 described herein having reduced current flow proximate the STI region 106 edges are particularly useful in reducing or eliminating noise when used as reset gate transistors and/or source follower transistors of CMOS image sensors or active pixel sensors (APSs), for example. The transistors 140 are also particularly useful in other noise-sensitive applications, such in flash memory applications, other small devices, and other advanced technologies in which traps originating from STI region 106 interfaces and gate dielectric 108 interfaces can be critical, as other examples.

The effective channel (e.g., within the buried channel 104) is forced far away from STI region 106 interface traps 107, so that the impact from STI interface traps 107 on noise performance of the transistors 140 is significantly reduced. The layout of the gate 110 can advantageously be modified to make room or space for landing of an overlying offset gate contact 120, without increasing the transistor 140 device layout area, in some embodiments (e.g., see the embodiment shown in FIG. 7). In some embodiments, the gate 110 material does not overlap the source and drain regions 112 and 114, for example, further decreasing the layout area for the transistors 140.

The conductance $G_m$ of the transistors 140 is increased with the implementation of the novel I-beam layout of the gates 110 in accordance with some embodiments. $G_m$ variation of the transistors 140 is also improved.

Embodiments of the present disclosure include the novel transistor 140 designs and methods of manufacturing the transistors 140 with improved noise performance described herein. Embodiments of the present disclosure also include image sensor circuits 150 that include the transistors 140 described herein.

In accordance with various embodiments of the present disclosure, a transistor includes a buried channel disposed in a workpiece, a gate dielectric disposed over the buried channel, and a gate layer disposed over the gate dielectric. The gate layer comprises an I shape in a top view of the transistor.

In accordance with various embodiments, a method of manufacturing a transistor includes providing a workpiece, forming a buried channel in the workpiece, and forming a gate dielectric over the buried channel. The method includes forming a gate layer comprising an I shape in a top view over the gate dielectric.

In accordance with various embodiments, an image sensor circuit includes a photo diode, a first transistor coupled to the photo diode, and a second transistor coupled to the first transistor. A third transistor is coupled to the first transistor and the second transistor. The second transistor or the third transistor comprises a channel disposed in a workpiece, a gate dielectric disposed over the channel, and a gate layer disposed over the gate dielectric. The gate layer of the second transistor or the third transistor comprises an I shape in a top view.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A transistor, comprising:
   a buried channel disposed in a workpiece, wherein a top surface of the buried channel resides a non-zero distance beneath a top surface of the workpiece;
   a gate dielectric disposed over the buried channel; and
   a gate layer disposed over the gate dielectric, wherein the gate layer comprises an I shape in a top view of the transistor.

2. The transistor according to claim 1, further comprising a source region disposed on a first side of the buried channel and a drain region disposed on a second side of the buried channel.

3. The transistor according to claim 2, further comprising a source contact coupled to the source region, a drain contact coupled to the drain region, and a gate contact coupled to the gate layer.

4. The transistor according to claim 3, wherein the gate contact is offset from the source contact and the drain contact.

5. The transistor according to claim 3, wherein the gate contact is closer to the drain contact than the source contact.

6. The transistor according to claim 1, wherein a portion of the gate layer comprises the I shape, and wherein the gate layer further comprises a plurality of the I shaped portions in the top view, wherein each of the plurality of I shaped portions is coupled to another of the plurality of I shaped portions.

7. The transistor according to claim 1, wherein the gate layer comprises a first elongated member, a second elongated member coupled to a first end of the first elongated member, and a third elongated member coupled to a second end of the first elongated member, and wherein the second elongated member and the third elongated member are positioned about perpendicular to the first elongated member.

8. The transistor according to claim 7, further comprising a shallow trench isolation (STI) region in the workpiece proximate the transistor, wherein a portion of the second elongated member of the gate layer is disposed over a first edge of the STI region, and wherein a portion of the third elongated member of the gate layer is disposed over a second edge of the STI region.

9. The transistor according to claim 7, wherein the second elongated member and the third elongated member comprise an increased width proximate the first end and the second end, respectively, of the first elongated member.

10. A method of manufacturing a transistor, the method comprising:
    forming a buried channel in a workpiece, wherein a top surface of the buried channel resides a non-zero distance beneath a top surface of the workpiece;
    forming a gate dielectric over the buried channel; and
    forming a gate layer comprising an I shape in a top view over the gate dielectric.

11. The method according to claim 10, wherein forming the buried channel comprises implanting a dopant into the workpiece beneath a top surface of the workpiece.

12. The method according to claim 11, wherein implanting the dopant comprises implanting B, P, or As about 0.05 to 0.5 μm beneath the top surface of the workpiece.

13. The method according to claim 10, further comprising implanting the gate layer with a dopant to form a P+ gate layer.

14. An image sensor circuit, comprising:
    a photo diode;
    a first transistor coupled to the photo diode;
    a second transistor coupled to the first transistor; and
    a third transistor coupled to the first transistor and the second transistor, wherein the second transistor or the third transistor comprises a channel disposed in a workpiece, a gate dielectric disposed over the channel, and a gate layer disposed over the gate dielectric, and wherein the gate layer comprises an I shape in a top view.

15. The image sensor circuit according to claim 14, wherein the channel comprises a buried channel.

16. The image sensor circuit according to claim 14, wherein the first transistor comprises a transfer gate transistor, the second transistor comprises a reset gate transistor, and the third transistor comprises a source follower transistor.

17. The image sensor circuit according to claim 16, further comprising a plurality of the photo diodes.

18. The image sensor circuit according to claim 16, wherein the transfer gate transistor comprises a source, a drain, and a gate, wherein the reset gate transistor comprises a source, a drain, and a gate, wherein the source follower transistor comprises a source, a drain, and a gate, wherein the photo diode comprises a first side and a second side, and wherein a first side of the photo diode is coupled to a return voltage, a second side of the photo diode is coupled to the source of the transfer gate transistor, and the drain of the transfer gate transistor is coupled to the source of the reset gate transistor and the gate of the source follower transistor.

19. The image sensor circuit according to claim 18, further comprising a fourth transistor having a source, a drain, and a gate, wherein the drain of the fourth transistor is coupled to the source of the third transistor, and wherein the source of the fourth transistor is coupled to a current source.

20. The image sensor circuit according to claim 19, wherein the fourth transistor comprises a row select transistor.

* * * * *